United States Patent
Sasaoka et al.

(10) Patent No.: US 8,033,382 B2
(45) Date of Patent: Oct. 11, 2011

(54) WORKPIECE TRANSFER APPARATUS AND ELECTRONIC COMPONENT TRANSFER APPARATUS

(75) Inventors: Yoshikazu Sasaoka, Toyama (JP); Satoru Takeuchi, Echizen (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 12/246,079

(22) Filed: Oct. 6, 2008

(65) Prior Publication Data

US 2009/0090601 A1 Apr. 9, 2009

Related U.S. Application Data

(63) Continuation of application No. PCT/JP2007/059361, filed on May 2, 2007.

(30) Foreign Application Priority Data

May 24, 2006 (JP) ................................. 2006-144557

(51) Int. Cl.
*B65G 47/22* (2006.01)
*B65G 17/46* (2006.01)
(52) U.S. Cl. ...... 198/493; 198/393; 198/608; 198/689.1
(58) Field of Classification Search ............... 198/689.1, 198/608, 493, 393
See application file for complete search history.

(56) References Cited

U.S. PATENT DOCUMENTS

| | | | | |
|---|---|---|---|---|
| 2,831,587 | A * | 4/1958 | Rearick | 198/525 |
| 4,346,722 | A * | 8/1982 | Schregenberger | 134/62 |
| 5,842,579 | A * | 12/1998 | Garcia et al. | 209/573 |
| 6,906,508 | B1 * | 6/2005 | Saulnier et al. | 324/756.07 |
| 2002/0050443 | A1 | 5/2002 | Kurabe et al. | |
| 2004/0159591 | A1 | 8/2004 | Kojima et al. | |

FOREIGN PATENT DOCUMENTS

| | | |
|---|---|---|
| CN | 1733576 A | 2/2006 |
| JP | 2002-68471 | 3/2002 |
| JP | 2002-068471 | 3/2002 |
| JP | 2004-226101 | 8/2004 |
| JP | 2006-027881 | 2/2006 |
| JP | 2006-27881 | 2/2006 |

OTHER PUBLICATIONS

International Search Report with English language translation.
Written Opinion with English language translation.
Taiwan Office Action received Apr. 8, 2010.
Chinese Office Action issued Dec. 14, 2010 in connection with corresponding Chinese Patent Application No. 200780015272.7 (JP2004-226101 was previously filed in an IDS submitted Oct. 6, 2008 and is therefore not enclosed.).

* cited by examiner

*Primary Examiner* — Kavel Singh
(74) *Attorney, Agent, or Firm* — Ostrolenk Faber LLP

(57) ABSTRACT

An electronic-component conveying apparatus that conveys an electronic component by holding the electronic component in a through hole provided in a conveying table of the apparatus, in which the electronic component can be quickly and reliably dismounted from the through hole by using compressed gas, and undesired popout of the electronic component due to a residual pressure infrequently occurs, whereby the efficiency in the conveying process can be increased. A workpiece conveying apparatus includes a blowhole opening in a conveying surface of a conveying stage and configured such that an electronic component held in a through hole is dismounted by using compressed gas at a position where the through hole overlaps the blowhole while a conveying table is driven, a vacuum groove communicating with the blowhole and provided in a first surface of the conveying table, and an auxiliary blowhole connected to a compressed-gas supply device and opening in the conveying surface such as to be accessible to the vacuum groove.

5 Claims, 3 Drawing Sheets

WORKPIECE TRANSFER APPARATUS AND ELECTRONIC COMPONENT TRANSFER APPARATUS

CROSS-REFERENCE TO RELATED APPLICATIONS

This is a continuation under 35 U.S.C. §111(a) of PCT/JP2007/059361 filed May 2, 2007, and claims priority of JP2006-144557 filed May 24, 2006, both incorporated by reference.

BACKGROUND

1. Technical Field

The present disclosure relates to workpiece conveying apparatuses for conveying a number of workpieces such as chip electronic components, and more particularly to workpiece conveying apparatuses and electronic-component conveying apparatuses that convey workpieces by moving on a conveying stage a conveying table having through holes serving as holders in which workpieces are held.

2. Background Art

Conventionally, in manufacturing chip electronic components, after chip electronic components are fabricated, their properties are inspected, and, in accordance with the properties, the chip electronic components are sorted into non-defective and defective products. In some cases, the manufactured chip electronic components are classified into a plurality of groups in accordance with their properties. To automate such operations for higher productivity, various manufacturing apparatuses have been proposed.

For example, Patent Document 1 below discloses an example of such electronic-component conveying apparatuses. The electronic-component conveying apparatus includes a disc-shaped conveying table disposed on and in contact with a conveying surface of a table base so as to convey electronic components. The disc-shaped conveying table is connected to a rotary drive source in such a manner as to be rotatable about its central axis. The conveying table has along its circumferential direction a plurality of through holes each receiving one of the electronic components that are fed in sequence from a hopper. The electronic components are fed from the hopper into the respective through holes. When the conveying table rotates while sliding on the conveying surface of the table base, the electronic components are conveyed in the circumferential direction.

In this case, while the electronic components are conveyed in the circumferential direction, properties of the electronic components are measured. In accordance with the results of the measurement, the electronic components that have been subjected to the property measurement are dismounted from the through holes by arbitrary electronic-component dismounting means so as to be sorted into non-defective and defective products or classified according to the measured properties.

To maintain the position of the electronic components during the conveyance, the conveying surface is provided with vacuum recesses communicating with the through holes, and the vacuum recesses are connected to a vacuum source.

On the other hand, to dismounting the electronic components that have been subjected to the property measurement, a structure shown in FIG. 4 is used. As shown in FIG. 4, in an electronic-component conveying apparatus 101, the conveying table 102 has through holes 102a. Electronic components 104 are held in the through holes 102a. One surface 102b of the conveying table 102 is in contact with a conveying surface 103a of a table base 103.

In the conveying surface 103a of the table base 103, blowholes 103b open at positions at which the electronic components 104 are to be dismounted. The blowholes 103b extend from the conveying surface 103a through to a surface 103c, which is the surface opposite the conveying surface 103a, and is connected to a compressed-air supply hose 105. The compressed-air supply hose 105 is connected to a compressed-air supply source, such as a compressor or a gas cylinder.

When the electronic component 104 after the measurement is brought to the electronic-component dismounting position, the blowhole 103b having smaller diameter than that of the through hole 102a is beneath the through hole 102a. Then compressed air is blown through the blowhole 103b. The pressure of the compressed air moves the electronic component 104 to outside the through hole 102a. Thus, the electronic component 104 is dismounted.

In this method, since the electronic components 104 can be dismounted without receiving mechanical impact, the electronic components 104 are negligibly damaged.

Patent Document 1: Japanese Unexamined Patent Application Publication No. 2004-226101

As described above, the conveying table 102 moves independently from the table base 103 while sliding on the conveying surface 103a of the table base 103. Therefore, after the electronic component 104 is dismounted by using the compressed air, the conveying table 102 is further rotated. Consequently, the blowhole 103b is closed again by the surface 102b of the conveying table 102.

In this case, there will be no problems if the compressed air is completely released toward the through hole 102a when the electronic component 104 is dismounted, and subsequently the blowhole 103b is closed by the surface 102b of the conveying table 102 after the supply of the compressed air is stopped.

In some cases, however, if the conveying speed is increased, the opening of the blowhole 103b is closed by the conveying table 102 with some compressed air remaining inside the blowhole 103b. In such a case, the compressed air remaining inside the blowhole 103b acts as a residual pressure.

Thus, in some cases, when the conveying table 102 is further rotated and an adjacent through hole holding another electronic component therein that is not to be dismounted at the electronic-component dismounting position is positioned over the blowhole 103b, the electronic component that is not to be dismounted is sometimes dismounted because of the residual pressure. Therefore, in the conventional electronic-component conveying apparatus, the conveying table 102 needs to be stopped for a predetermined time period after the electronic component 104 is dismounted, without being rotated immediately, so that the air is completely released. That is, a waiting time is necessary for releasing the residual pressure, which prevents such an electronic-component conveying apparatus from being operated at a high speed.

Particularly, as the size of the electronic components becomes smaller, the size of the blowhole 103b also needs to be smaller. Since a smaller blowhole 103b cannot blow a sufficient volume of air, the waiting time for eliminating the residual pressure needs to be further increased. There is another problem that, even if the waiting time is increased, it is still difficult to sufficiently release the residual pressure.

SUMMARY

The apparatus disclosed herein solves the above-described problems in the conventional technique and provides a workpiece conveying apparatus having a structure that takes a workpiece out of a through hole by blowing a high-pressure gas through a blowhole toward the through hole in which the workpiece is held, and the workpiece conveying apparatus can solve the above-described problem associated with residual pressure and prevent unexpected popout of a workpiece, and accelerate the conveying process of dismounting the workpiece.

According to the present disclosure, a workpiece conveying apparatus comprises a conveying stage having a conveying surface on which a workpiece is conveyed; a conveying table having a first surface facing the conveying surface of the conveying stage, a second surface opposite the first surface, and a through hole extended from the first surface through to the second surface; and a driving device connected with at least one of the conveying table and the conveying stage in such a manner as to be capable of causing the conveying table to slidingly move with respect to the conveying surface of the conveying stage while the first surface of the conveying table faces the conveying surface of the conveying stage, wherein the workpiece is conveyed when the conveying table is moved with respect to the conveying surface while the workpiece is held in the through hole of the conveying table, wherein the conveying surface of the conveying stage has a vacuum recess extending in a conveying direction and a blowhole for blowing compressed gas at a workpiece dismounting position that is configured to overlap the through hole when dismounting of the workpiece held in the through hole is performed, wherein the first surface of the conveying table has a vacuum groove through which the blowhole and the vacuum recess communicate with each other, wherein the apparatus further comprises a vacuum device connected to the vacuum recess; and a compressed-gas supply device connected to the blowhole, and wherein the conveying surface of the conveying stage further has an auxiliary blowhole connected to the compressed-gas supply device and provided at the workpiece dismounting position in such a manner as to open toward the vacuum groove.

In the workpiece conveying apparatus according to the present disclosure, it is preferred that the conveying table have a center shaft and be configured to be rotated about the center shaft by the driving device, whereby a conveying path along which the workpiece is conveyed is defined along the circumferential direction of the conveying table, and that the vacuum recess is provided in the conveying surface of the conveying stage in such a manner as to extend along the circumferential direction of the conveying table. In this case, since the conveying path is defined on the conveying table along the circumferential direction thereof, the size of the workpiece conveying apparatus can be reduced, and the installation space thereof can also be reduced.

In the present disclosure, the workpiece is not limited to an electronic component, and may be a workpiece other than an electronic component. It should be noted that the size reduction of electronic components has been progressing rapidly. Since the sizes of electronic components are very small, a problem caused by a residual pressure during the conveying process can be effectively solved by using the disclosed workpiece conveying apparatus. That is, the workpiece conveying apparatus can be preferably used as an electronic-component conveying apparatus.

In the workpiece conveying apparatus according to the present disclosure, the conveying table is disposed in such a manner as to face the conveying surface of the conveying stage, and is moved with respect to the conveying surface while holding a workpiece in the through hole provided in the conveying table, whereby the workpiece is conveyed. Further, the conveying surface has the vacuum recess communicating with the through hole. By applying vacuum, an electronic component can be held in a proper position.

Additionally, compressed gas is blown through the blowhole at the workpiece dismounting position. With the pressure of the compressed gas, the workpiece conveyed to the workpiece dismounting position can be quickly dismounted from the through hole.

In this case, the auxiliary blowhole is connected to the compressed-gas supply device and is provided at the workpiece dismounting position. Therefore, the workpiece held by the vacuum recess is released from the vacuum recess by blown compressed gas blown through the auxiliary blowhole. Thus, the workpiece can be dismounted from the through hole more quickly.

If the auxiliary blowhole is not provided, a pressure sufficient not only for dismounting the workpiece but also for releasing the vacuum with which the workpiece has been held needs to be applied first by using the compressed gas blown through the blowhole. This means that a large volume of gas compressed at a high pressure needs to be blown through the blowhole. Before doing so, the vacuum needs to be released. After that, the workpiece is to be conveyed. Such circumstances lead to a problem that it takes a relatively long time to dismount the workpiece. Moreover, the necessity of blowing a highly compressed gas frequently leaves a residual pressure inside the blowhole. This easily triggers the above-described problem.

In contrast, as disclosed herein, the auxiliary blowhole is provided at the workpiece dismounting position and opens toward the vacuum groove. Therefore, the vacuum can be released first by using the compressed gas blown through the auxiliary blowhole. Then, at the moment when or after the vacuum is released, the workpiece is moved out from the through hole due to the compressed gas blown through the blowhole. In this case, since the vacuum is released beforehand, the workpiece can be assuredly dismounted from the through hole without blowing such a highly compressed gas through the blowhole. This infrequently leaves a residual pressure inside the blowhole. Accordingly, the waiting time is not necessary or can be reduced, whereby a workpiece can be conveyed and dismounted at a high speed. Additionally, undesired popout of a workpiece due to the residual pressure can be prevented.

Other features and advantages will become apparent from the following description of embodiments, which refers to the accompanying drawings.

DETAILED DESCRIPTION

Figure 1A:
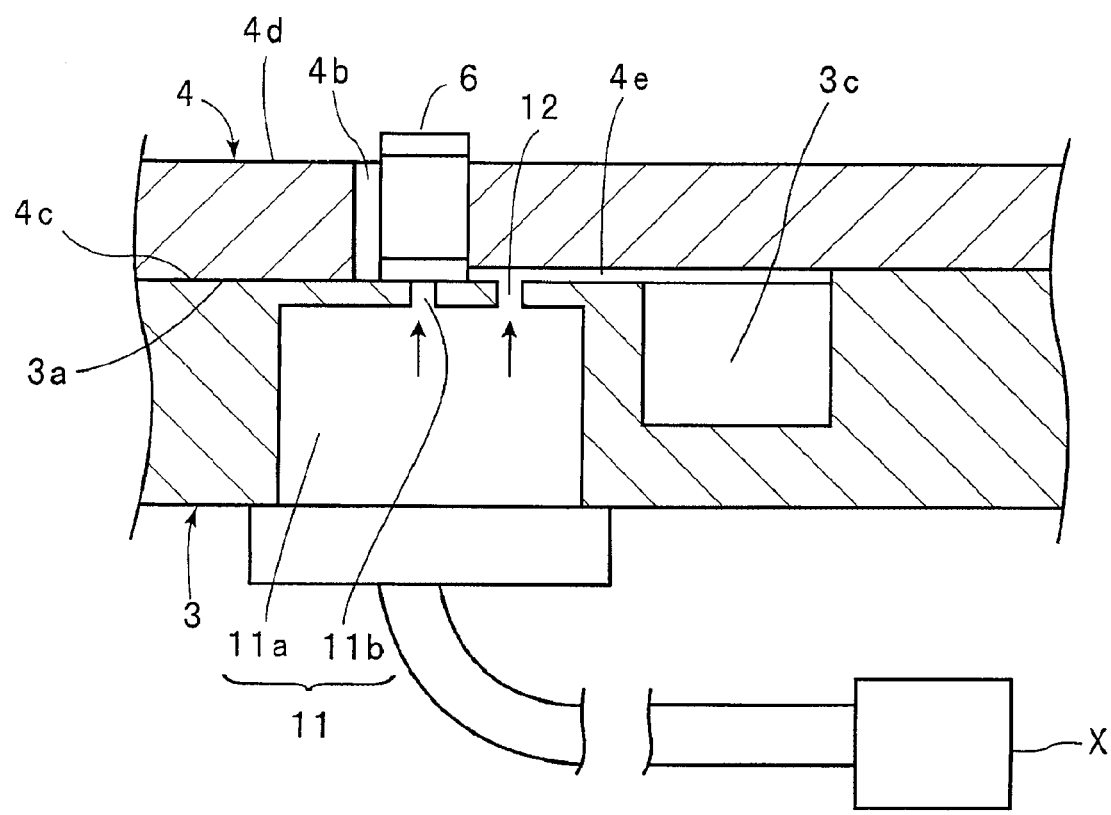
FIGS. 1(a) and 1(b) are a partial sectional side view and a schematic plan view showing the configuration of a electronic-component conveying apparatus according to a first embodiment of the present invention at a part at which an electronic component, a workpiece, is dismounted by using compressed air.

Reference Numerals 1 electronic-component conveying apparatus
2 base plate
3 conveying stage
3a conveying surface
3b, 3c vacuum recess
4c first surface
4d second surface
4 conveying table
4a center shaft
4b through hole
4e vacuum groove
5 driving device
6 electronic component
7 electronic-component feeding device
8 property measuring device
9 electronic-component dismounting device
10 vacuum source
11 blowhole
11a blowhole main portion
11b nozzle portion
12 auxiliary blowhole The apparatus will now be described in more detail by describing a specific embodiment thereof with reference to the drawings.

Figure 2A:
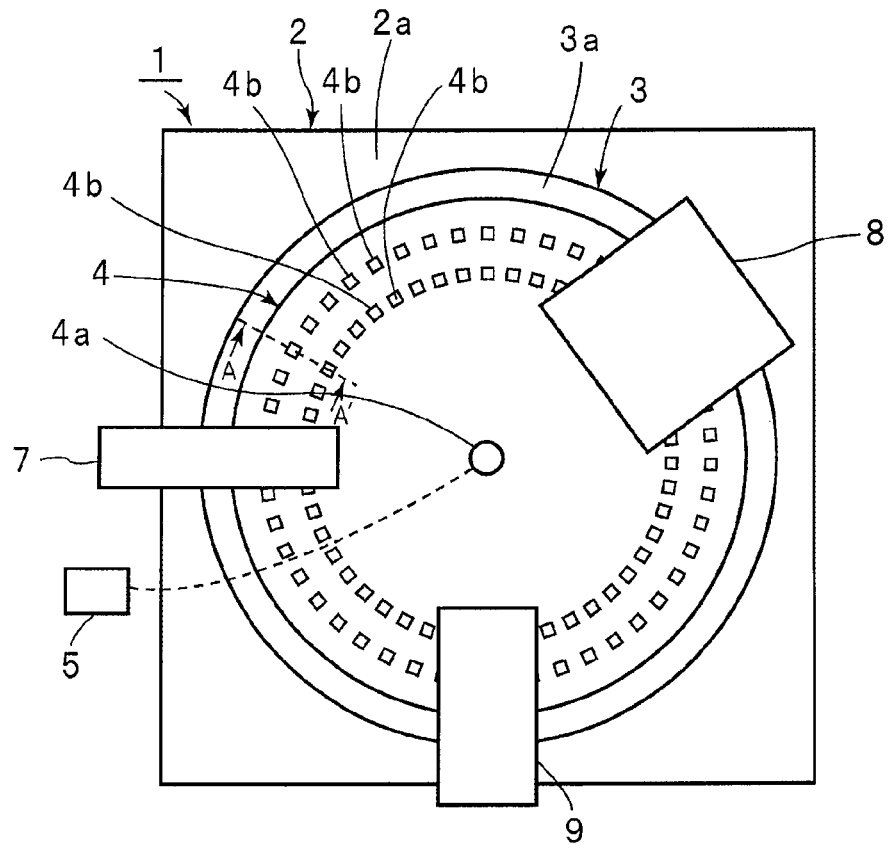
FIG. 2(a) is a front view showing an electronic-component conveying apparatus according to the first embodiment of the present invention.
Figure 2B:
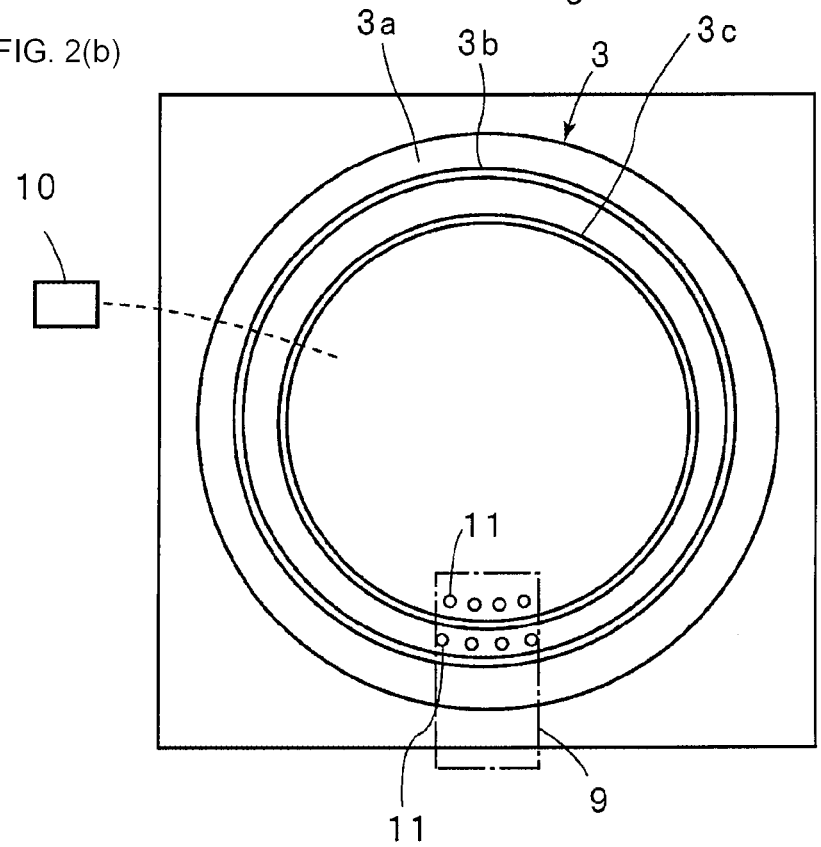
FIG. 2(b) is a front view showing vacuum recesses provided in a conveying surface thereof.

FIGS. 2(a) and 2(b) are a schematic front view showing an electronic-component conveying apparatus according to a first embodiment of the present invention and a schematic front view showing the apparatus without a conveying table, which will be described below.

An electronic-component conveying apparatus 1 includes a base plate 2. In the first embodiment, the base plate 2 is disposed upright in such a manner as to extend vertically in an installation space. Needless to say, the base plate 2 may be disposed at an angle with respect to the vertical position, or may be disposed in such a manner as to extend horizontally.

The base plate 2 has on one surface 2a thereof a conveying stage 3. In the first embodiment, the conveying stage 3 is a disc-shaped plate. However, the conveying stage 3 may be of another shape such as a rectangle. The conveying stage 3 is secured to the base plate 2. The conveying stage 3 has a conveying surface 3a opposite the surface fixed to the base plate 2.

A conveying table 4 is disposed on the conveying surface 3a. The conveying table 4 has a disc-like shape. The conveying table 4 is disposed in such a manner as to be rotatable about a center shaft 4a, which is connected to a driving device 5 shown schematically. The driving device 5 causes the conveying table 4 to rotate clockwise.

In the first embodiment, the conveying table 4 rotates about the center shaft 4a clockwise. However, the conveying table 4 may be secured while the conveying stage 3 rotates about the center shaft 4a, or the conveying stage 3 and the conveying table 4 may both rotate about the center shaft 4a at different speeds or in opposite directions.

That is, it is only necessary that the conveying table 4 be moved relative to the conveying surface 3a of the conveying stage 3.

The conveying table 4 is made of a hard material, such as metal or plastic. The conveying table 4 has a plurality of through holes 4b arranged in the circumferential direction near the periphery thereof. The through holes 4b serve as holders in which electronic components, workpieces, are held. The through holes 4b are provided in two rows along the circumferential direction.

Needless to say, the number of rows of the through holes 4b is arbitrary, and may be one or three or more.

Figure 3:
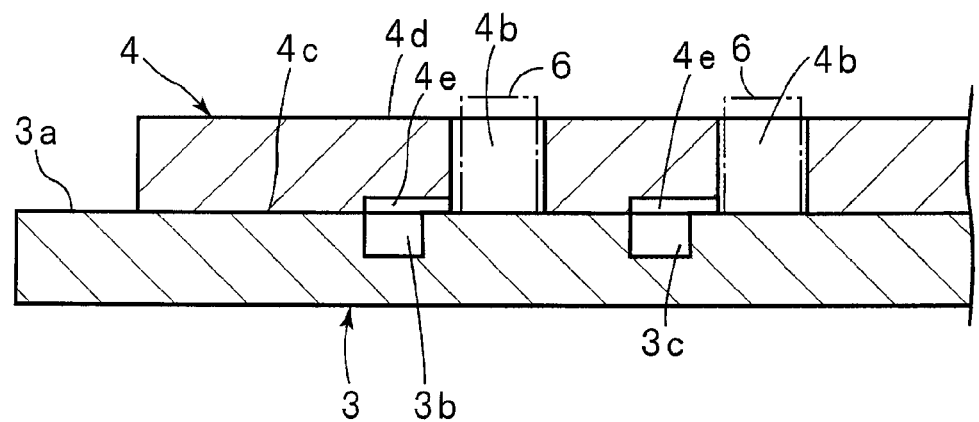
FIG. 3 is an enlarged sectional side view of a part taken along line A-A' in FIG. 2(a).
Figure 4:
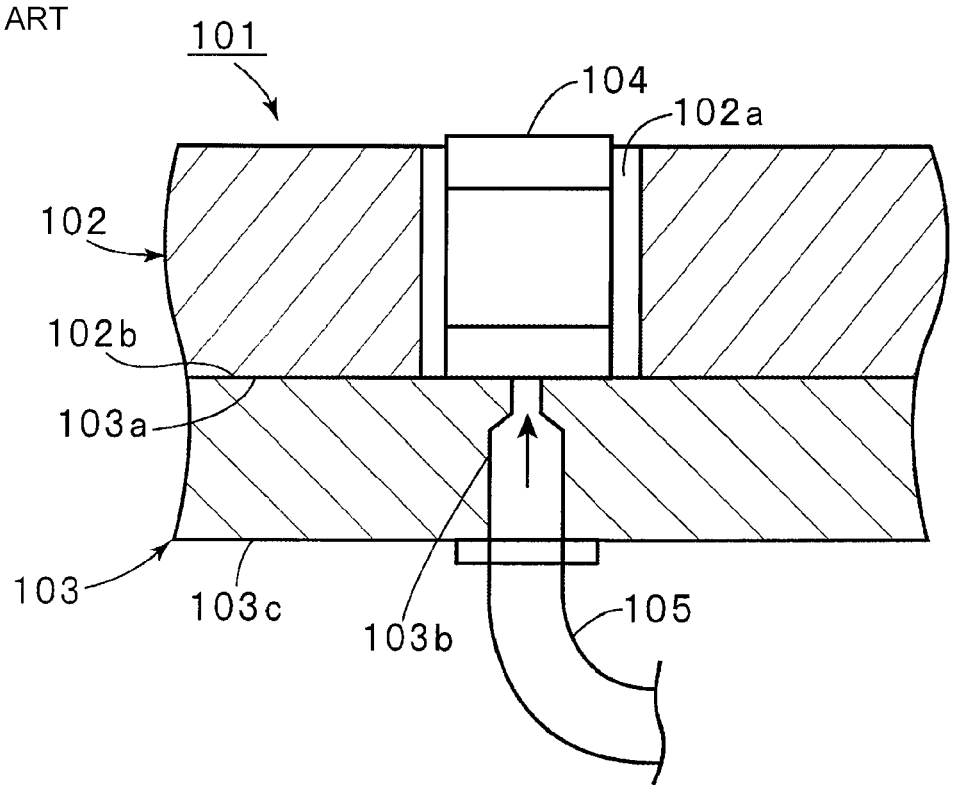
FIG. 4 is a schematic sectional front view showing a conventional electronic-component conveying apparatus at a part at which an electronic component is dismounted.

FIG. 3 shows a sectional view of a part taken along line A-A' in FIG. 2. As is seen in FIG. 3, the conveying table 4 has a first surface 4c that is in contact with or in proximity to the conveying surface 3a of the conveying stage 3, and a second surface 4d that is a surface opposite the first surface 4c. The through holes 4b are extended from the first surface 4c through to the second surface 4d. A opening of each through hole 4b in the second surface 4d is of a size that can accommodate an electronic component 6.

In the first embodiment, the opening of the through hole 4b in the second surface 4d is of a rectangular shape.

Referring back to FIG. 2(a), electronic components are inserted from a side facing the second surface 4d of the conveying table 4 into the through holes 4b by an electronic-component feeding device 7. The electronic-component feeding device 7 may be a hopper or another arbitrary electronic-component feeding device without limitation.

With the clockwise rotation of the conveying table 4, the conveying table 4 moves in such a manner that the first surface 4c of the conveying table 4 slides on the conveying surface 3a of the conveying stage 3. Consequently, the electronic components 6 held in the through holes 4b are conveyed in the circumferential direction of the conveying table 4. At a position in the conveying path, a property measuring device 8 is disposed. The property measuring device 8 has, for example, a plurality of probes that are to be brought into contact with electrodes of the electronic components, for the purpose of measuring electric properties of the electronic components 6. In accordance with the results of this measurement, determination of whether the product is non-defective or defective is made, or, in accordance with the measured properties, the electronic components being conveyed are classified into groups.

The property measuring device 8 may be any of various electrical measuring devices according to properties to be measured.

On the other hand, referring to FIG. 2(b) showing the conveying surface 3a of the conveying stage 3 exposed without the conveying table 4, the conveying surface 3a has two vacuum recesses 3b and 3c provided concentrically therein. The vacuum recesses 3b and 3c communicate, through vacuum grooves to be described below, with part of the through holes 4b of the conveying table 4 provided immediately above the conveying stage 3. The two vacuum recesses 3b and 3c are provided concentrically because the through holes are regularly arranged in two rows along the circumferential direction. That is, the vacuum recess 3b is provided on the outer side of the circle along which the through holes 4b in the outer one of the two rows are arranged, and the vacuum recess 3c is provided on the outer side of the smaller circle along which the through holes 4b in the other row are arranged. Thus, the through holes 4b in the outer row communicate with the vacuum recess 3b through the vacuum grooves to be described below, and the through holes 4b in the inner row communicate with the inner vacuum recesses 3c through the vacuum grooves to be described below. As shown in FIG. 2(b), the vacuum recesses 3b and 3c are connected to a vacuum source 10.

Referring to FIG. 3, the through holes 4b communicate with vacuum grooves 4e extending in the first surface 4c of the conveying table 4 along the circumferential direction of the conveying table 4. The vacuum grooves 4e are provided in such a manner as to partially overlap the vacuum recess 3b or the vacuum recess 3c.

Therefore, by applying vacuum to electronic components with the vacuum source 10 through the vacuum recesses 3b and 3c, the electronic components can be held in a proper position in the through holes 4b under the negative pressure produced by the vacuum source 10.

On the other hand, referring to FIG. 2(b), at a position where an electronic-component dismounting device 9 is disposed, a plurality of blowholes 11 open in the conveying surface 3a.

Figure 1B:
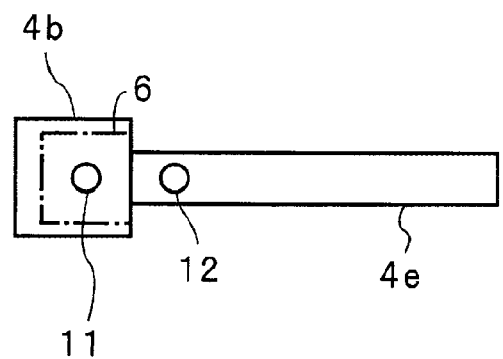

FIGS. 1(a) and 1(b) are a schematic sectional side view and a schematic front view of a part in the conveying path at which the electronic-component dismounting device 9 is disposed.

In the first embodiment, the vacuum grooves 4e are provided in the first surface 4c of the conveying table 4 in such a manner as to communicate with the through holes 4b. In addition, the conveying surface 3a has auxiliary blowholes 12 near the blowholes 11 at the electronic-component dismounting position, the auxiliary blowholes 12 opening toward the vacuum grooves 4e.

Each of the auxiliary blowholes 12 communicates with a blowhole main portion 11a of the blowhole 11. The blowhole 11 has the blowhole main portion 11a and a nozzle portion 11b communicating therewith and extending through to the conveying surface 3a. The blowhole main portion 11a is connected to a compressed-air supply source X such as a gas cylinder or a compressor. Since the auxiliary blowhole 12 communicates with the blowhole main portion 11a, the compressed air is blown not only through the nozzle portion 11b of the blowhole 11 but also through the auxiliary blowhole 12.

As described above, since the auxiliary blowhole 12 opens at a position within the vacuum grooves 4e, the compressed air is blown not only through the nozzle portion 11b of the blowhole 11 but also through the auxiliary blowhole 12. The pressure inside the vacuum grooves 4e is negative because of the above-described vacuum. However, when the compressed air is supplied through the auxiliary blowhole 12, the negative pressure is released. This makes it easier to take the electronic component 6, a workpiece, out of the through hole 4b. That is, since the negative pressure is released, only a small pressure produced by the compressed air applied to the electronic component 6 through the blowhole 11 can cause the electronic component 6 to be quickly dismounted of the through hole 4b. To summarize, since the compressed air is blown not only through the nozzle portion 11b of the blowhole 11 but also through the auxiliary blowhole 12, when the compressed air is blown through the nozzle portion 11b of the blowhole 11, the electronic component 6 can be quickly dismounted from the through hole 4b.

As described above, in the first embodiment, the auxiliary blowhole 12 opens at a position within the vacuum grooves 4e, to which the compressed air is supplied, whereby the negative pressure is released. Since the negative pressure inside the vacuum grooves 4e is released, the pressure of the compressed air supplied through the nozzle portion 11b of the blowhole 11 for causing the electronic component 6, a workpiece, to pop out of the through hole 4b may be small. This suppresses the occurrence of a residual pressure inside the blowhole 11. Therefore, even if another electronic component 6 is conveyed to the position above the same blowhole 11 after the blowing of the compressed air but the electronic component 6 is not to be dismounted there, undesired popout of the electronic component 6 due to the residual pressure can be suppressed.

Next, the operation of the electronic-component conveying apparatus according to the first embodiment will be described.

Referring to FIGS. 2(a) and 2(b), during conveying of electronic components while sorting them in accordance with their properties by using the electronic-component conveying apparatus 1, the electronic-component feeding device 7 inserts the electronic components one by one into the through holes 4b provided in the conveying table 4. The conveying table 4 is rotated clockwise by actuating the driving device 5. Accordingly, the electronic components 6 held in the through holes 4b are conveyed clockwise in the circumferential direction of the conveying table 4. In this case, vacuum is applied to the electronic components 6 through the vacuum recesses 3b and 3c. Therefore, the electronic components 6 are conveyed in a proper position in the through holes 4b.

The property measuring device 8 measures the properties of the electronic components 6 being conveyed. In accordance with the results of the measurement, the electronic components are sorted. That is, the position where the electronic-component dismounting device 9 dismounts the electronic components is determined, including whether to dismount non-defective products at a certain position and defective products at another position, or to dismount the electronic components at different positions in accordance with the measured properties. Such an operation of the electronic-component dismounting device 9 of dismounting the electronic components at certain electronic-component dismounting positions in accordance with the results of the property measurement can be controlled by connecting controlling means to the electronic-component conveying apparatus 1 and operating the electronic-component dismounting device in accordance with the results obtained from the property measuring device 8.

When the electronic components 6 held in the through holes 4b are conveyed to the electronic-component dismounting device 9 with the rotation of the conveying table 4, the through holes 4b overlap the blowholes 11 provided at positions where the electronic components are to be dismounted. In this state, the auxiliary blowholes 12 have access to the vacuum grooves 4e.

This causes the compressed air to be supplied through the auxiliary blowholes 12 to the vacuum grooves 4e, whereby the negative pressure inside the vacuum grooves 4e is released. On the other hand, the compressed air is blown through the nozzle portions 11b of the blowholes 11 toward the electronic components 6. However, since the negative pressure inside the vacuum grooves 4e is released as described above, only a relatively small pressure is necessary for dismounting the electronic components 6. Thus, because the necessary pressure can be set to a small value, a residual pressure is infrequently left inside the blowhole main portions 11a and the nozzle portions 11b of the blowholes 11 after the electronic components 6 have been dismounted.

Accordingly, the above-described waiting time is not necessary, or, even if necessary, may be only a short time. This dramatically increases the efficiency in the conveying operation of the conveying apparatus.

In the first embodiment, the conveying table is of a disc-like shape and driven to rotate clockwise about the center shaft 4a. However, the conveying table is not necessarily of a disc-like shape. Moreover, the conveying table may be moved in a linear direction or the like. Thus, a conveying path may be defined in such a manner that the through holes provided in the conveying table are moved in another direction, not in the rotating direction. That is, the workpiece conveying apparatus is not limited to that in which a disc-shaped conveying table is rotated relative to the conveying surface of a conveying stage.

Further, while the above-described electronic-component conveying apparatus conveys electronic components as workpieces, the apparatus may also be used for conveying workpieces other than electronic components.

Further, while the compressed gas used in the first embodiment is compressed air, the compressed gas may also be another inert gas such as nitrogen.

Although particular embodiments have been described, many other variations and modifications and other uses will become apparent to those skilled in the art. Therefore, the present invention is not limited by the specific disclosure herein.

What is claimed is:

1. A workpiece conveying apparatus comprising:
a conveying stage having a conveying surface on which a workpiece is conveyed;
a conveying table having a first surface facing the conveying surface of the conveying stage, a second surface opposite the first surface, and a through hole configured for holding the workpiece, extended from the first surface through to the second surface; and
a driving device connected with at least one of the conveying table and the conveying stage for causing the conveying table to move with respect to the conveying surface of the conveying stage while the first surface of the conveying table faces the conveying surface of the conveying stage, wherein the workpiece is conveyed when the conveying table is moved with respect to the conveying surface while the workpiece is held in the through hole of the conveying table,
wherein the conveying surface of the conveying stage has a vacuum recess extending in a conveying direction and the first surface of the conveying table has a vacuum groove communicating between the vacuum recess and the through hole, and
wherein the conveying surface further has a blowhole for blowing compressed gas at the through hole for dismounting the workpiece held in the through hole,
wherein the blowhole and the vacuum recess communicate with each other through the vacuum groove,
wherein the apparatus further includes
a vacuum connector for connecting a vacuum source to the vacuum recess; and
a compressed-gas connector for connecting a compressed-gas supply source to the blowhole, and
wherein the conveying surface of the conveying stage further has an auxiliary blowhole connected to the compressed-gas connector for supplying compressed gas from the compressed-gas supply source to the vacuum groove to release negative pressure in the vacuum groove,
the auxiliary blowhole being provided at a position spaced away from the through hole in such a manner as to supply said compressed gas to the vacuum groove only at said position spaced away from the through hole.

2. The workpiece conveying apparatus according to claim 1,
wherein the conveying table has a center shaft and is configured to be rotated about the center shaft by the driving device, whereby a conveying path along which the workpiece is conveyed is defined along the circumferential direction of the conveying table, and
wherein the vacuum recess is provided in the conveying surface of the conveying stage in such a manner as to extend along the circumferential direction of the conveying table.

3. The workpiece conveying apparatus according to claim 1, further comprising a vacuum source connected to said vacuum connector.

4. The workpiece conveying apparatus according to claim 1, further comprising a compressed-gas supply source connected to said compressed-gas connector.

5. The workpiece conveying apparatus according to claim 1,
wherein the auxiliary blowhole is connected to the blowhole in such a manner that the auxiliary blowhole supplies the compressed gas to the vacuum groove at the same time the blowhole supplies the compressed gas to the through hole.

* * * * *